United States Patent
Han

(10) Patent No.: US 9,613,718 B2
(45) Date of Patent: Apr. 4, 2017

(54) DETECTION SYSTEM FOR DETECTING FAIL BLOCK USING LOGIC BLOCK ADDRESS AND DATA BUFFER ADDRESS IN A STORAGE TESTER

(71) Applicant: UNITEST INC., Gyeonggi-do (KR)

(72) Inventor: Young Myoun Han, Gangwon-do (KR)

(73) Assignee: UNITEST INC., Yongin-si, Gyeonggi-do (KR)

( * ) Notice: Subject to any disclaimer, the term of this patent is extended or adjusted under 35 U.S.C. 154(b) by 78 days.

(21) Appl. No.: 14/453,647

(22) Filed: Aug. 7, 2014

(65) Prior Publication Data
US 2015/0095723 A1 Apr. 2, 2015

(30) Foreign Application Priority Data
Sep. 30, 2013 (KR) .................. 10-2013-0116138

(51) Int. Cl.
| | |
|---|---|
| G11C 29/56 | (2006.01) |
| G11C 7/10 | (2006.01) |
| G11C 13/00 | (2006.01) |
| G06F 11/10 | (2006.01) |
| G06F 11/273 | (2006.01) |
| G11C 29/12 | (2006.01) |
| G06F 12/06 | (2006.01) |
| G11C 29/04 | (2006.01) |

(52) U.S. Cl.
CPC .......... *G11C 29/56* (2013.01); *G06F 11/1068* (2013.01); *G06F 11/273* (2013.01); *G06F 11/2733* (2013.01); *G06F 12/063* (2013.01); *G11C 7/1006* (2013.01); *G11C 13/0069* (2013.01); *G11C 29/1201* (2013.01); *G11C 29/56004* (2013.01); *G11C 2029/0409* (2013.01); *G11C 2029/5606* (2013.01)

(58) Field of Classification Search
CPC .............. G11C 29/56; G11C 29/56004; G11C 2029/5606; G11C 2029/0409; G11C 7/1006; G11C 13/0069; G11C 29/1201; G06F 11/1068; G06F 11/273; G06F 11/2733; G06F 12/063
USPC ........... 714/54, 719, 715, 742; 365/200, 201
See application file for complete search history.

(56) References Cited

U.S. PATENT DOCUMENTS

| | | | | |
|---|---|---|---|---|
| 7,992,061 B2* | 8/2011 | Zeng | ...................... | G11C 29/52 365/185.29 |
| 8,966,155 B1* | 2/2015 | Mulligan | ............ | G06F 12/0246 711/103 |
| 9,111,598 B2* | 8/2015 | Jibbe | .................... | G11C 7/1006 |
| 2009/0222617 A1* | 9/2009 | Yano | ................... | G06F 12/0246 711/103 |

(Continued)

FOREIGN PATENT DOCUMENTS

KR    10-2010-0114697 A    10/2010

*Primary Examiner* — John J Tabone, Jr.
(74) *Attorney, Agent, or Firm* — Rabin & Berdo, P.C.

(57) ABSTRACT

Disclosed is a detection system for detecting fail block using logic block address and data buffer address in a storage tester, which is capable of comparing data read from SSD test without expected data buffer. The system comprises a device driver for controlling HBA; a request processor for reading the request to Root Complex and transmitting the result to a data engine; and the data engine for generating data to be transmitted to SSD and comparing the read data.

5 Claims, 3 Drawing Sheets

(56) References Cited

U.S. PATENT DOCUMENTS

| | | | |
|---|---|---|---|
| 2010/0077117 A1* | 3/2010 | Asnaashari | G06F 13/385 710/74 |
| 2010/0125767 A1* | 5/2010 | Zeng | G11C 29/52 714/723 |
| 2011/0138136 A1* | 6/2011 | Shitomi | G06F 3/0604 711/154 |
| 2011/0153930 A1* | 6/2011 | Serizawa | G06F 3/0613 711/114 |
| 2012/0059976 A1* | 3/2012 | Rosenband | G06F 3/061 711/103 |
| 2012/0110259 A1* | 5/2012 | Mills | G06F 13/00 711/113 |
| 2013/0086311 A1* | 4/2013 | Huang | G06F 13/1689 711/103 |
| 2013/0124932 A1* | 5/2013 | Schuh | G06F 9/44 714/718 |
| 2013/0275835 A1* | 10/2013 | Aswadhati | G06F 11/1068 714/773 |
| 2013/0297894 A1* | 11/2013 | Cohen | G06F 3/0679 711/154 |
| 2014/0006659 A1* | 1/2014 | Foong | G06F 12/063 710/74 |
| 2014/0059278 A1* | 2/2014 | Schuh | G06F 12/0246 711/103 |
| 2014/0325141 A1* | 10/2014 | Liu | G06F 12/0246 711/112 |
| 2015/0078111 A1* | 3/2015 | Jibbe | G11C 7/1006 365/218 |
| 2015/0095712 A1* | 4/2015 | Han | G11C 29/1201 714/42 |

* cited by examiner

DETECTION SYSTEM FOR DETECTING FAIL BLOCK USING LOGIC BLOCK ADDRESS AND DATA BUFFER ADDRESS IN A STORAGE TESTER

BACKGROUND OF THE INVENTION

1. Field of the Invention

The present invention relates to a detection system for detecting failure block, in particular, to a detection system for detecting failure block using logic block address and data buffer in a storage tester, capable of comparing data read in Solid State Drive (SSD) test without an expected data buffer unlike a conventional method storing data generated by a pattern generator and a pattern data generator in a buffer.

2. Description of the Related Art

There is prior art related to a device for testing storage filed or disclosed such as Korea patent publication No. 10-2010-0114697 (hereinafter referred to as "cited reference"), and etc.

The cited reference aforementioned comprises a storage interface unit for maintaining interface with storage; a user interface unit for receiving test condition from user for storage test; a test pattern generation unit for generating test pattern for storage test corresponding to the test condition received from the user; a test control unit for controlling the storage test through the test pattern.

But a conventional testing device from the prior art including the cited reference performs writing data of specific pattern on SSD Device and reads back, and compares to check whether the data is valid in order to detect fail LBA (Logic Block Address) of flash array. This kind of device stores data generated from pattern data generator in buffer (expected data buffer). The stored data read back from SSD Device, and is compared with the contents of the data buffer to determine fail. This type of method will have a problem with capacity of usable buffer.

Currently, capacity of SSD reaches hundreds of gigabytes. Increasing the capacity of expected data buffer will bring various restriction issues. For example if the capacity is configured too small, dataRead/Write is performed with small data blocks and overall testing time will be increased. However, if it is configured too large for better performance, it will require a capacity of memory which cannot be accepted in perspective of system.

SUMMARY OF THE INVENTION

The present invention is derived to consider those problems above, and is to provide fail block detection system using data buffer address and logic block address in a storage tester which can compare data read from SSD test without expected data buffer.

In order to achieve this technical matter, the present invention relates to a detection system for detecting fail block using logic block address and data buffer address in a storage tester, and the system comprises a device driver for controlling HBA; a request processor for reading the request to Root Complex and transmitting the result to a data engine; and the data engine for generating data to be transmitted to SSD and comparing the read data.

Also, the device driver comprises a control unit for generating Read/Write command on the SSD, and controlling test mode and various commands; a LBA generation unit for generating random LBA or sequential LBA in order to access to LBA of SSD during command generation of the control unit.

Also, the control unit as a block generating ATA (Advanced Technology Attachment) command used for the SSD communicates with HBA (Host Bridge Adapter) managing the SSD, makes HBA perform DMA operation by accessing register of the HBA in order to read/write data on SSD.

Also, the command comprises size and base address of Data Buffer for Read/Write, and information of LBA (Logic Block Address) of the SSD.

And also the request processor, in case Mwr packet transmittance flag is transmitted for the device driver to access HBA register, decodes the flag such that Root Complex completes Write on HBA register.

In case the HBA sends Mrd (Memory Read Request) packet in order to request Command Header information, the request processor connects the packet to the device driver, reads the packet and connects that in order to transmit relevant information from the device driver to Cpld (Completion with Data) packet.

And the data engine comprises a pattern data generation unit for performing DMA (direct Memory Access) operation for reading or writing data on SSD by control of the device driver, generating random data with Seed value made by using memory address requested by the request processor and LBA generated by the device driver and resetting data generation logic in case the amount of request data of packet is accumulated as a specific sector; a comparison unit for determining whether the data of the LBA is the same by comparing expected data generated by the pattern data generation unit and data read from SSD, i.e. data of HBA Mwr (Memory Write Request) on operation of Read & compare; and a fail record storing unit for storing fail information in case that the result of the comparison unit is not the same.

According to the present invention, the amount of memory doesn't need to be increased in order to store expected data and shorten the overall time for test.

And according to the present invention, comparison by write/read operation for overall LBA of SSD in random mode is possible, and also usable in sequential mode in which address is increased by constant value.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF SPECIFIC EMBODIMENTS

Figure 1:
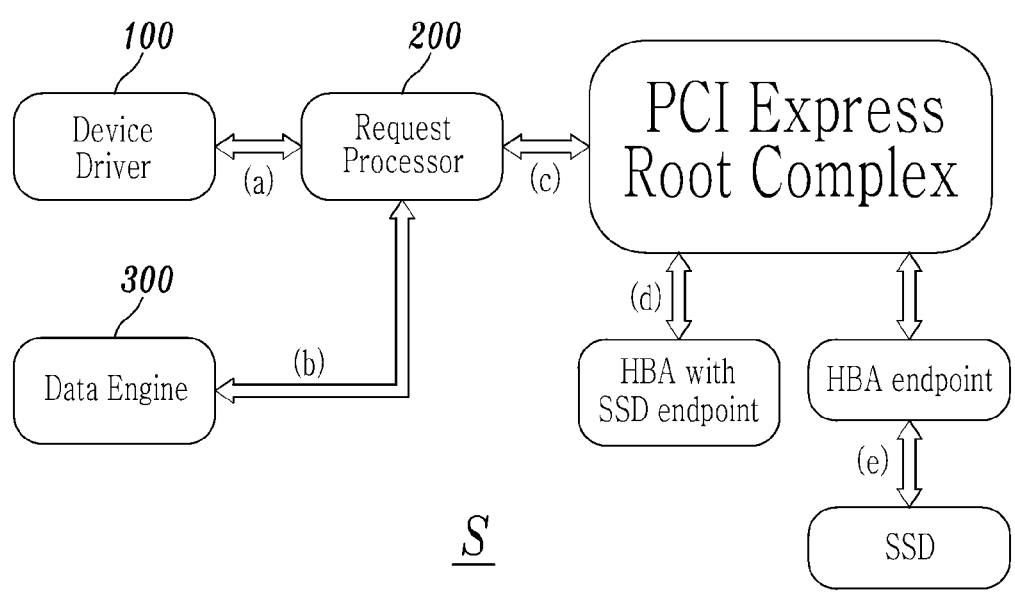
FIG. 1 is an overall configuration diagram of a detection system for detecting fail block using logic block address and data buffer address in a storage tester.
Figure 2:
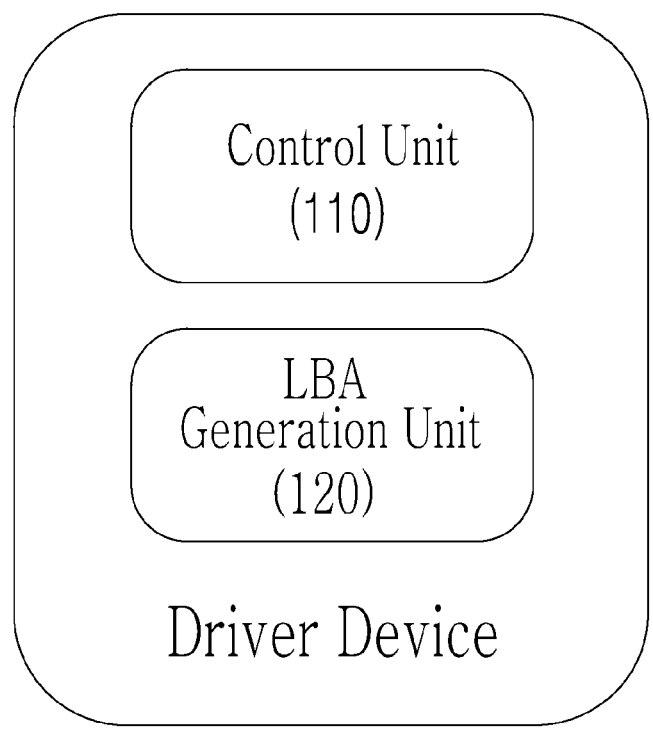
FIG. 2 is a detailed configuration diagram of a device driver according to the invention.
Figure 3:
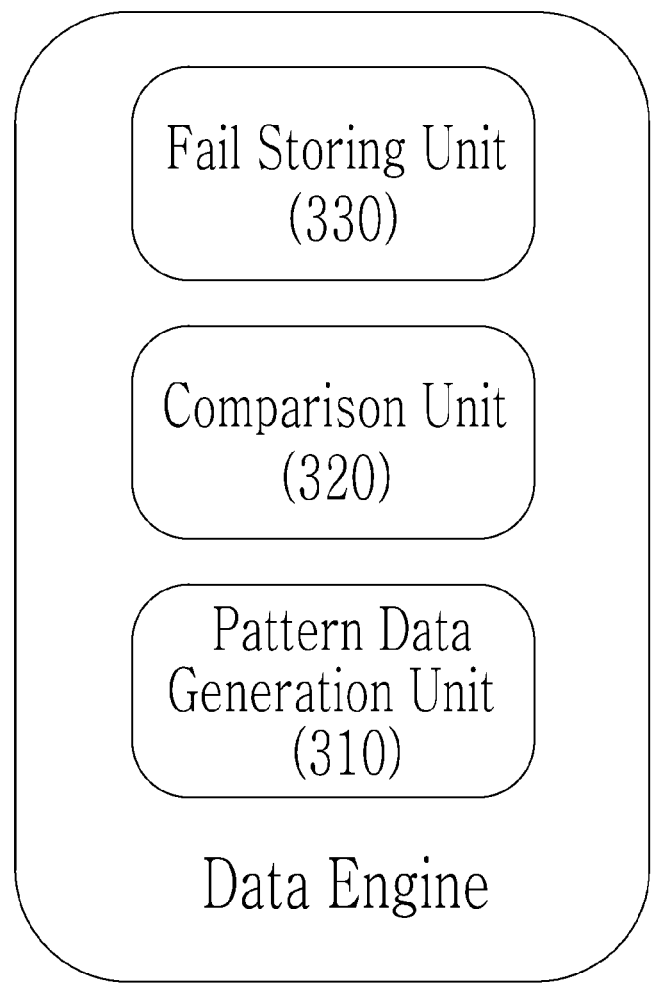
FIG. 3 is a detailed configuration diagram of a data engine unit according to the invention.

Hereinafter, a detailed description will be given of the present invention. Referring to FIGS. 1 to 3, a detection system for detecting fail block using logic block address and data buffer address in a storage tester is described as follows.

FIG. 1 is a conceptually illustrated overall configuration diagram of a detection system (S) for detecting fail block using logic block address and data buffer address in a storage tester. As illustrated, the system comprises a device driver 100 for controlling HBA, a request processor 200 for reading request to Root Complex and transmitting the result to the device driver 100 and a data engine 300, and the data engine 300 for comparing read data.

As illustrated in FIG. 1, a user logic block comprising a device driver 100, a request processor 200, and a data engine 300 are located around PCIe Root Complex (RC), and HBA EP (Host Bridge Adapter Endpoint) are located below RC. EPs communicate with RC through data link, SSD communicate with endpoint in the same way as SATA or SAS. The user logic block comprising a device driver 100, a request processor 200, and a data engine 300 reads packet requesting to RC and responds to that.

Currently, there are two types of SSD, that is, SAS type and PCIe (PCI express) type in SSD. In SAS type, SSD requires an external form of HBA, and in PCIe type SATA device and HBA are included. SSD is connected to PCIe Bus of computer system through an external HBA while in PCIe type the device itself is connected to PCIe for operation.

Data Link marked as (a)~(e) are described as follows.

Link (e) comprises data link with SCSI level of packet such as SATA, SAS. Link (d) comprises data link with packets of Memory Read Request (Mrd), Memory Write Request (Mrw), Completion with Data (Cpld), and so on. In the present invention Mrd, Mwr contain memory of data buffer to be read from or written on SSD. And link (a), (b), and (c), as user logic of the present invention, send information of packet coming into Root Complex (RC) for example, Cpld to Mrd as response, or connect data of Mwr to data buffer.

The device driver 100 includes a control unit 110 and a LBA generation unit 120 as shown in FIG. 2.

In particular, the control unit 110 generates Read/Write command for SSD, controls test mode and various commands.

Herein, the control unit 110 as a block for generating ATA (Advanced Technology Attachment) command used for SSD communicates with HBA (Host Bridge Adapter) such as AHCI (Advanced Host Controller Interface) managing SSD. Those commands include information about size and base address of data buffer for Read/Write, and LBA (Logic Block Address). Based on the information, HBA performs DMA (Direct Memory Access) operation to read or write on SSD.

That is, the control unit 110 controls HBA (SATA, SAS). In order to read/write data on SSD, the control unit accesses HBA register and allows HBA to perform DMA operation.

LBA generation unit 120 during SSD test has random LBA mode in which access is made as LBA increases sequentially and Random LBA Mode in which random LBA is used.

Accordingly, LBA generation unit 120 generates random LBA or sequential LBA to access LBA of SSD.

Thus, LBA generation unit 120 generates LBA according to test mode when the control unit 110 generates commands.

The request processor 200 receives information for request sent to Root Complex by HBA EP (Endpoint), and transmits that to the device driver 100 and the data engine 300.

For example, if the device driver 100 transmits Mwr packet transmission flag to access HBA register, the flag is decoded and Root Complex completes writing the relevant information on HBA register.

Thereafter, if HBA sends Mrd (Memory Read Request) packet to request Command Header information to Root Complex, the packet is read and connected such that the packet can be connected to the device driver 100 and the relevant information can be transmitted from the device driver 100 to Cpld (Completion with Data) packet.

The data engine 300 comprises a pattern data generation unit 310, a comparison unit 320, and a fail record storing unit 330 as shown in FIG. 3.

Specifically, the pattern data generation unit 310 performs DMA (Direct Memory Access) operation to read or write on data on SSD by control of the control unit 110.

Herein, the pattern data generation unit 310 generates random data with Seed value made by using memory address requested to the request processor 200 and LBA generated through LBA generation unit 120.

More specifically, the pattern data generation unit 310 generates data needed to be written on SSD, and generates expected Data on operation of Read & compare. Also Mrd request is received to the request processor 200 on operation of Write.

The amount of request data is accumulated in the packet, and when the amount is accumulated as much as I-Sector, requested address and LBA of command are added to generate Seed and reset logic.

Herein, relevant LBA under same Seed Factor will store the same data regardless of random or sequential LBA because random data generated with the same Seed value is stored.

Because of this, additional memory for storing expected data is not needed. Herein, Seed Factor is a variable to avoid the same pattern data to be stored in LBA all the time by being added to basic Seed value.

The comparison unit 320 on operation of Read & compare, compares expected data generated by the pattern data generation unit 310 and data of HBA Mwr (Memory Write Request) i.e. data read from SSD, and determines by comparison whether the relevant LBA data are same or not, in case the data are not same, fail information is stored in the fail record storing unit 330.

Thus, the fail record storing unit 330 stores LBA and expected data and read data, etc. in which failure occurs.

As described above, the present invention is not limited by the embodiments and the accompanying drawings. Possible for a large number of changes and modifications to the category of the technical idea disclosed in the present invention without departing from the present invention to those skilled in the art will be able to understand better.

Appropriate, all such changes and modifications and equivalents as fall within the scope of the invention, therefore, can be considered.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A detection system for detecting a fail block in a solid state drive (SSD) managed by a host bridge adapter (HBA) using a logic block address (LBA), the detection system comprising:
   a device driver configured to generate an Advanced Technology Attachment (ATA) command, which includes the LBA, for communication with the HBA;
   a data engine for generating data to be transmitted to the SSD, and for detecting the fail block; and
   a request processor connecting the device driver and the data engine, the device driver controlling the data engine via the request processor, wherein
   the data engine includes
      a pattern data generation unit configured to generate random data with a seed value using a memory address requested to the request processor and the LBA, for storing the random data on the SSD at the LBA, and a comparison unit configured to compare data read from the SSD at the LBA with expected data corresponding thereto, the expected data being the random data generated by the pattern data generation unit for the LBA.

2. The detection system of claim 1, wherein the device driver comprises a control unit for generating a Read/Write command on the SSD; and a LBA generation unit for generating a random LBA or a sequential LBA for use as the LBA of the SSD.

3. The detection system of claim 1, wherein the control unit commands the HBA to perform a direct memory access (DMA) operation by accessing a register of the HBA in order to read/write the data on the SSD.

4. The detection system of claim 3, wherein the ATA command further comprises information of a size and a base address of a Data Buffer for Read/Write.

5. The detection system of claim 1, wherein the pattern data generation unit is further configured to perform a direct memory access (DMA) operation for reading or writing the data on the SSD;

and the data engine further includes a fail record storing unit for storing fail information in case that the random data are not the same as the read data.

* * * * *